United States Patent [19]

Hsu et al.

[11] Patent Number: 5,554,558
[45] Date of Patent: Sep. 10, 1996

[54] METHOD OF MAKING HIGH PRECISION W-POLYCIDE-TO-POLY CAPACITORS IN DIGITAL/ANALOG PROCESS

[75] Inventors: Shun-Liang Hsu; Jyh-Kang Ting; Chun-Yi Shih, all of Hsin-Chu, Taiwan

[73] Assignee: Taiwan Semiconductor Manufacturing Company, Hsin-Chu, Taiwan

[21] Appl. No.: 387,081

[22] Filed: Feb. 13, 1995

[51] Int. Cl.$^6$ .............................. H01L 21/70; H01L 27/00
[52] U.S. Cl. .............................. 437/60; 437/919; 437/200
[58] Field of Search .................................. 437/47, 52, 60, 437/919, 200

[56] References Cited

U.S. PATENT DOCUMENTS

| | | | |
|---|---|---|---|
| 4,697,330 | 10/1987 | Paterson et al. | 437/42 |
| 4,971,924 | 11/1990 | Tigelaar et al. | 437/60 |
| 5,037,772 | 8/1991 | McDonald | 437/52 |
| 5,338,701 | 8/1994 | Hsu et al. | 437/60 |

FOREIGN PATENT DOCUMENTS 0183623 11/1985 European Pat. Off. .

*Primary Examiner*—H. Jey Tsai
*Attorney, Agent, or Firm*—George O. Saile; Stephen B. Ackerman

[57] ABSTRACT

A method for making a polycide-to-polysilicon capacitor, which has a reduced IPO thickness and low voltage coefficient, is described. A first layer of doped polysilicon is formed over a silicon substrate. A silicide layer is formed over the first layer of doped polysilicon. The first layer of doped polysilicon and the silicide layer are patterned to form a polycide bottom plate of the capacitor. An oxide layer is formed over the bottom plate. The oxide layer is densified. A second layer of doped polysilicon is formed over the oxide layer. The second layer of polysilicon is patterned to form a top plate of the capacitor. The oxide layer is removed except under the top plate of the capacitor, where it acts as a capacitor dielectric, and, finally, the bottom plate is annealed.

12 Claims, 6 Drawing Sheets

5,554,558

METHOD OF MAKING HIGH PRECISION W-POLYCIDE-TO-POLY CAPACITORS IN DIGITAL/ANALOG PROCESS

RELATED PATENT APPLICATION

1) "Fabrication of W-Polycide-to-Poly Capacitors with High Linearity", inventors S. L. Hsu, M. S. Lin, M. D. Lei, Ser. No. 08/102,977, filing date Jul. 28, 1993, U.S. Pat. No. 5,393,691.

BACKGROUND OF THE INVENTION

(1) Field of the Invention

The invention relates to the manufacture of highly dense integrated circuits and more particularly to the formation of polycide-to-polysilicon capacitors having reduced thickness and low voltage coefficient.

(2) Description of the Related Art

In recent years there continues to be dramatic density increases in integrated circuit technology. The minimum feature size of lithography has been reduced to below one micrometer. In the fabrication of precision capacitors at these reduced dimensions, it is increasingly difficult to maintain such parameters as low voltage and temperature coefficients and low leakage current.

Workers in the field have described the formation of capacitors using two layers of polysilicon. McDonald in U.S. Pat. No. 5,037,772 describes a method for fabricating a polysilicon-to-polysilicon capacitor on the same chip as CMOS and BiCMOS devices. A first polysilicon layer is deposited and ion-implanted with arsenic. A silicon oxide/silicon nitride dielectric layer is then formed and patterned to the capacitor dimensions. A second polysilicon layer is deposited. An anisotropic etch is then performed, with the dielectric layer acting as a mask to protect the first polysilicon layer.

In European Patent Application 0 183 623, Krishner also describes a process for producing a precision polysilicon-to-polysilicon capacitor in conjunction with MOS devices on the same chip. However, it is noted that the deposition of silicon nitride as part of the dielectric layer causes uniformity problems, due to the difficulty of depositing a uniformly thick layer of the silicon nitride. Thus a single layer of thermally grown silicon oxide is used as the capacitor dielectric. The oxidation process includes an annealing step. The dielectric layer is grown from a first polysilicon layer that has been ion-implanted with phosphorus or arsenic. A low energy implant is described which allows for precise control of the subsequent dielectric thickness. However, neither this approach nor that in U.S. Pat. No. 5,037,772 directly addresses the problem of a high capacitor voltage coefficient.

In addition, the use of polycide gates and capacitors, polycide being a combination of layers of polysilicon and a refractory metal silicide, is becoming very important as the industry moves to smaller device geometries. As these geometries become smaller, polysilicon becomes less satisfactory due to its high resistivity and the subsequent affect on RC time delays and IR voltage drops. The use of a combination of a top-layer refractory metal silicide with polysilicon, to form a polycide, has proven suitable because of its lower resistivity.

A method of forming a polycide-to-polysilicon capacitor and CMOS integrated circuit is described in U.S. Pat. No. 5,338,701, to the same assignee as the invention. A heavy ion-implant of the polycide bottom plate of the capacitor improves capacitor characteristics. However, as feature sizes are reduced to one micrometer or less, requiring reduced IPO (InterPoly Oxide) thickness, it is difficult to form a capacitor with a sufficiently low voltage coefficient, due to the asymmetry effect, i.e., the differences between the materials used in the top and bottom capacitor electrodes. This is due to differences in Fermi energy between the polysilicon and polycide electrodes.

SUMMARY OF THE INVENTION

It is therefore a principal object of the invention to provide a method for making a polycide-to-polysilicon capacitor which has a reduced IPO thickness and low voltage coefficient.

These objects are achieved by forming a first layer of doped polysilicon over a silicon substrate. A silicide layer is formed over the first layer of doped polysilicon. The first layer of doped polysilicon and the silicide layer are patterned to form a polycide bottom plate of the capacitor. An oxide layer is formed over the bottom plate. The oxide layer is densified. A second layer of doped polysilicon is formed over the oxide layer. The second layer of polysilicon is patterned to form a top plate of the capacitor. The oxide layer is removed except under the top plate of the capacitor, where it acts as a capacitor dielectric. The bottom plate is annealed.

DESCRIPTION OF THE PREFERRED EMBODIMENTS

Figure 1:
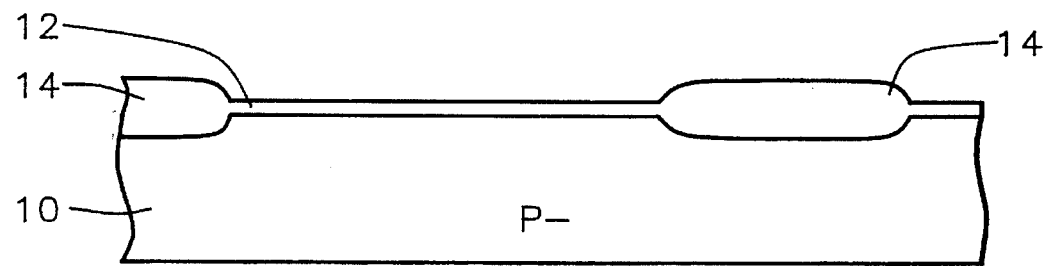
FIGS. 1 to 6 are a cross-sectional representation of the method of the invention for fabricating a polycide-to-polysilicon capacitor.

Referring now to FIG. 1, there is shown a lightly doped p-type substrate 10, preferably composed of silicon having a (100) crystallographic orientation. Field oxide regions 14 having a thickness of between about 4000 and 6000 Angstroms are formed by well-known processes in the art, such as by LOCOS (LOCal Oxidation of Silicon). The field oxide regions are used to isolate semiconductor regions from other such regions, and to isolate the capacitor from the semiconductor regions. The surface of the silicon substrate 10 is thermally oxidized to form a gate oxide 12 to a thickness of between about 100 and 200 Angstroms.

Figure 2:
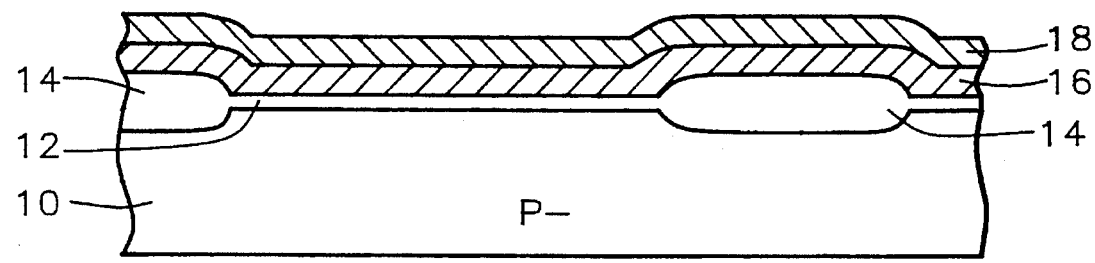

With reference to FIG. 2, a first layer of polysilicon 16 is blanket deposited over gate oxide 12 and field oxide regions 14, by LPCVD (Low Pressure Chemical Vapor Deposition), to a thickness of between about 1000 and 2000 Angstroms. The polysilicon layer 16 is doped by diffusion with phosphorus using phosphorus oxychloride ($POCl_3$) as a source at a temperature of between about 800° and 920° C., or alternately is ion implanted, to provide the proper conductivity.

Silicide layer 18 is then blanket deposited over the polysilicon 16 by LPCVD. This layer is formed of tungsten silicide ($WSi_x$), which is formed by reacting tungsten fluoride ($WF_6$) with silane ($SiH_4$), and is formed to a thickness of between about 1000 and 2000 Angstroms. As a result of this deposition, it is believed that fluorine atoms are trapped in the $WSi_x$ layer at a concentration of about $10^{20}$ atoms/cm.$^3$.

The amorphous refractory metal silicide layer has a chemical formulation of $WSi_x$, where x is between about 2.3 and 2.8. An x value above this range would result in an undesirably high resistivity for the silicide film. An x value below this range increases the stress of the $WSi_x$ film and leads to adhesion problems between the silicide and polysilicon.

Figure 3:
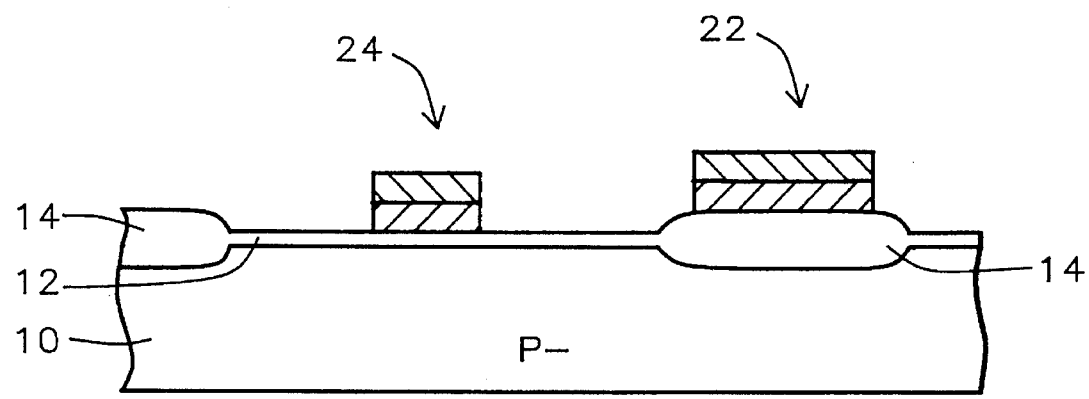

The polycide (polysilicon 16 and silicide 18) is now patterned, by reactive ion etching with $SF_6$ (sulfur hexafluoride) and HBr (hydrogen bromide), to form the polycide capacitor bottom plate 22, and a polycide gate 24 for an FET (Field Effect Transistor) device to be formed, as shown in FIG. 3.

Figure 4:
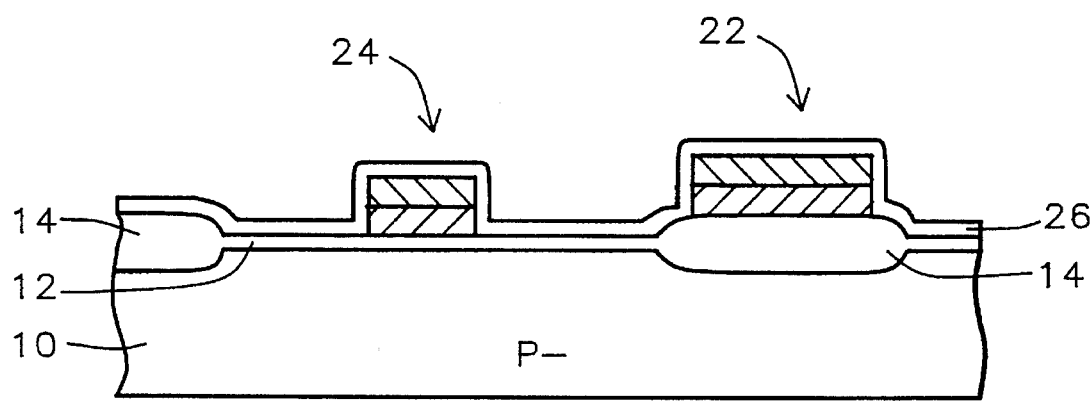

Referring now to FIG. 4, oxide layer 26 is formed over the FIG. 3 structure. Different deposition methods are used depending on the circuit density. For example, for 0.8 or 1.0 micron technology, the oxide layer 26 is deposited using LPCVD by decomposing TEOS (tetraethoxysilane) at a temperature of between about 650° and 750° C., to form an oxide having a thickness of between about 600 and 1200 Angstroms. For 0.6 micron dimensions, an HTO (High Temperature Oxide) process is used utilizing $N_2O$ (nitrous oxide) and $SiH_2Cl_2$ at a temperature of between about 750° and 850° C., to form oxide 26 to a thickness of between about 300 and 500 Angstroms.

The capacitance C is defined by the equation $$C = (e_{ox}/T_{ox})A$$

where $e_{ox}$ is the fixed dielectric constant of the oxide, $T_{ox}$ is the oxide thickness, and A is the capacitor area. As the smaller device densities are used, the area A needs to be decreased, and so to maintain the unit capacitance, $T_{ox}$ must be reduced. As noted earlier, however, it is difficult to reduce the oxide thickness and provide a sufficiently low $V_{cc}$ (voltage coefficient). The voltage coefficient is the change of capacitance over a voltage range, and is measured in parts per million/volt, or ppm/v. For a 0.6 micron design, it is desirable to have a $V_{cc}$ of about 50 ppm/v or below.

In a critical step of the invention, the oxide 26 is densified at a temperature of between about 800° and 900° C., in an atmosphere of between about 5 and 10% $O_2$ (oxygen), by volume. The densification is conducted by furnace, with the following process details. The wafer is first heated to about 800° C. for about 30 minutes in 100% $N_2$ having a flow rate of about 10,000 sccm (standard cubic centimeters per minute). The second step is as noted above, i.e., heating to between about 800° and 900° C. for about 30 minutes in 5–10% $O_2$. where the $O_2$ flow rate is between about 500 and 1,000 sccm, and the $N_2$ flow rate is about 10,000 sccm. The densification increases the oxide thickness by between about 20 and 40 Angstroms. This thickness increase is due to the following. The increase of IPO thickness is involved with the effect of F (fluorine) ions on decreasing dielectric constant. Consequently, the oxygen in the IPO densification ambient will penetrate through the IPO and oxidize the $WSi_x$ surface.

Figure 5:
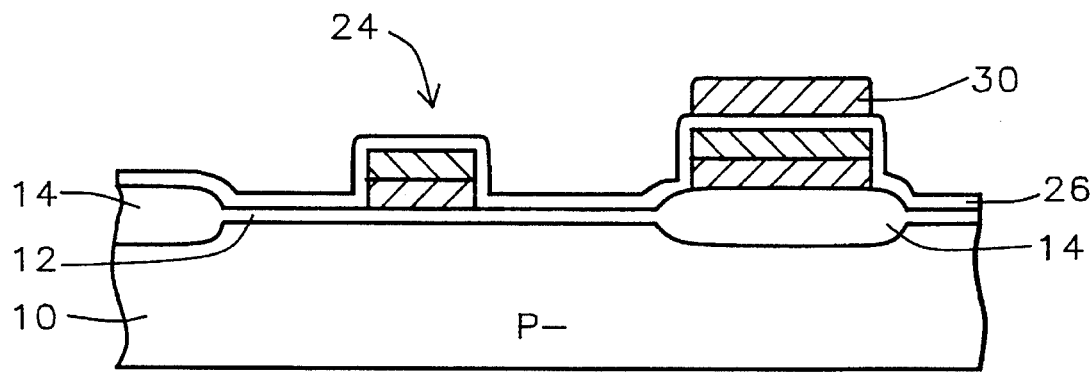

A second polysilicon layer 30 is deposited by LPCVD to a thickness of between about 2500 and 4000 Angstroms, and is doped in the same manner as the first polysilicon 22. Polysilicon layer 30 is then patterned by conventional lithography and etching to form the capacitor top plate, as shown in FIG. 5.

Figure 6:
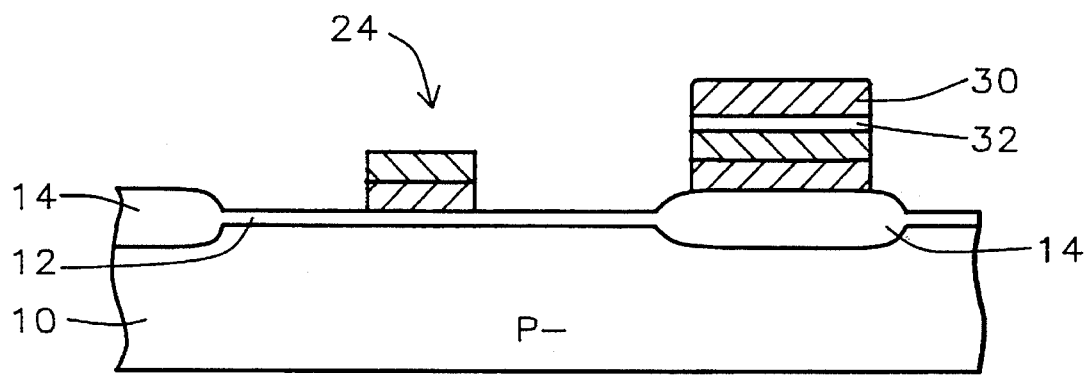

Referring now to FIG. 6, oxide 26 is removed by an etch of 50:1 BOE (buffered oxide etch) or 50:1 HF (hydroflouric acid) for between about 3 and 5 minutes, in all but the area under the top capacitor plate, where it acts as IPO (InterPoly Oxide) 32 for the polycide-to-polysilicon capacitor. The silicide layer is then annealed at a temperature of between about 850° and 1000° C. for between about 30 and 60 minutes, to cause the amorphous refractory metal silicide to change into its crystalline phase.

The FET device is completed by forming source and drain regions in the substrate, adjacent to polycide gate 24, by methods well known in the art. Subsequent processing takes place, including, for example, metallization and passivation, that are not important to the invention and thus are not described in detail. It will be understood by those skilled in the art that the invention is not limited to formation of a single N channel FET, since a P channel FET could be formed by doping the substrate with an N-type dopant and implanting P-type impurities for the source and drain. A CMOS (Complementary Metal Oxide Semiconductor) device could also be formed.

Figure 7:
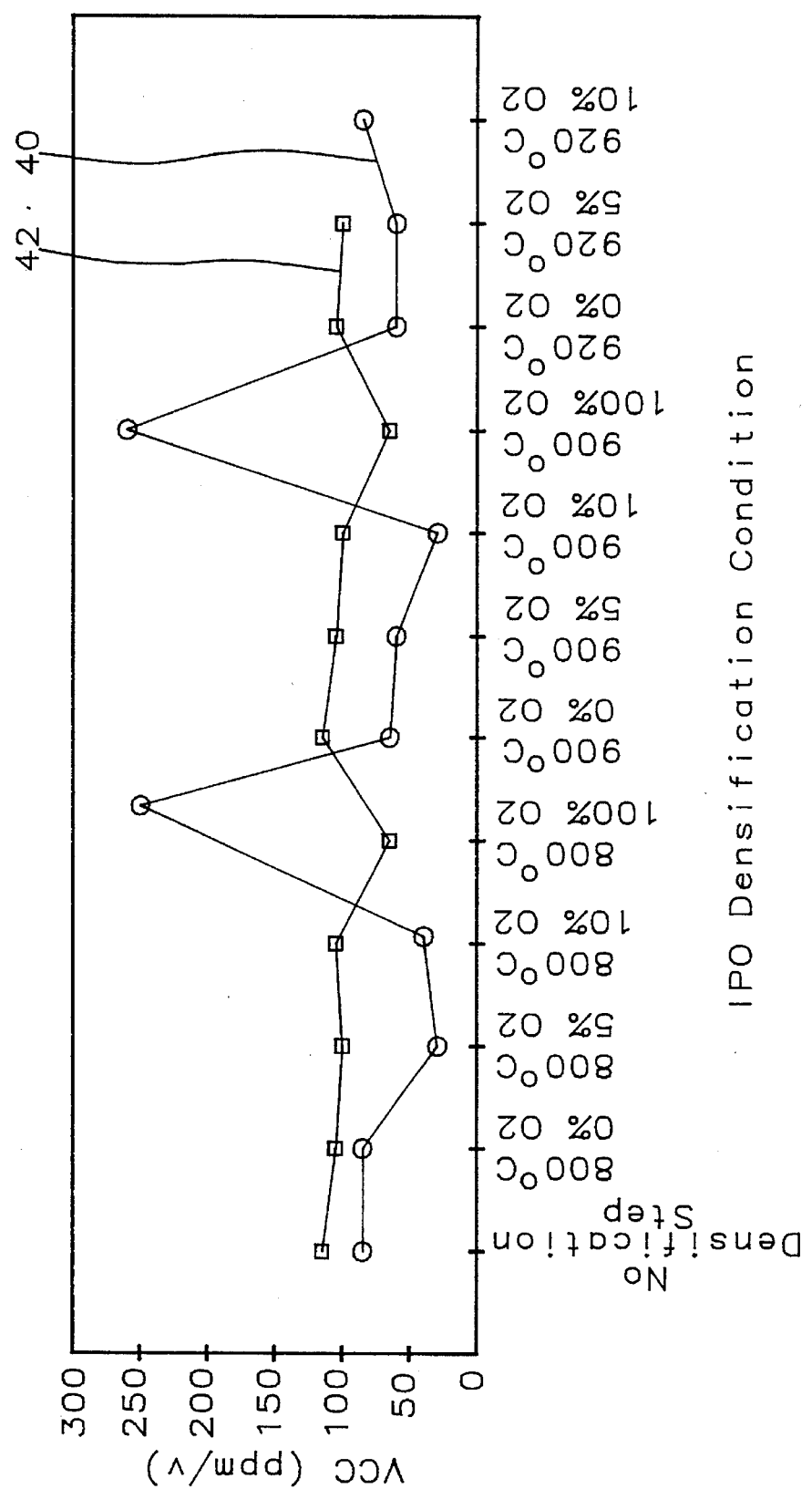
FIG. 7 is a graphical representation of the voltage coefficient for capacitors manufactured by the method of the invention, over a range of IPO densification conditions, as compared to a capacitors formed using a prior art method.

Characteristics of examples of capacitors formed using the method of the invention, and also using prior art methods, are shown graphically in FIGS. 7 to 10. Capacitors were formed at varying IPO densification conditions, specifically by changing the temperature and $O_2$ composition, and measurements were taken, as shown. In FIG. 7, the voltage coefficient $V_{cc}$ is depicted by line 40, for a capacitor formed by the method of the invention with no ion implant of the polycide, whereas line 42 shows the voltage coefficient for a prior art capacitor with an implanted (using P31 phosphorus at a dosage of about $3\times10^{15}$ atoms/cm.$^2$) polycide. The lower the voltage coefficient, the more stable the capacitor is over a range of voltages. As can be seen in FIG. 7, $V_{cc}$ of about 50 ppm/v was achieved at the invention conditions of IPO densification temperatures of 800° or 900° C., and at 5–10% $O_2$. Thus to obtain a low $V_{cc}$, the use of 5–10% $O_2$ in IPO densification is crucial for an unimplanted, approximately 400 Angstrom capacitor. Moreover, 100% $O_2$ results in an undesirably high $V_{cc}$, which, as can be seen in FIG. 7, is the opposite result from that of the implanted capacitor in which 100% $O_2$ improves the VCC.

Figure 8:
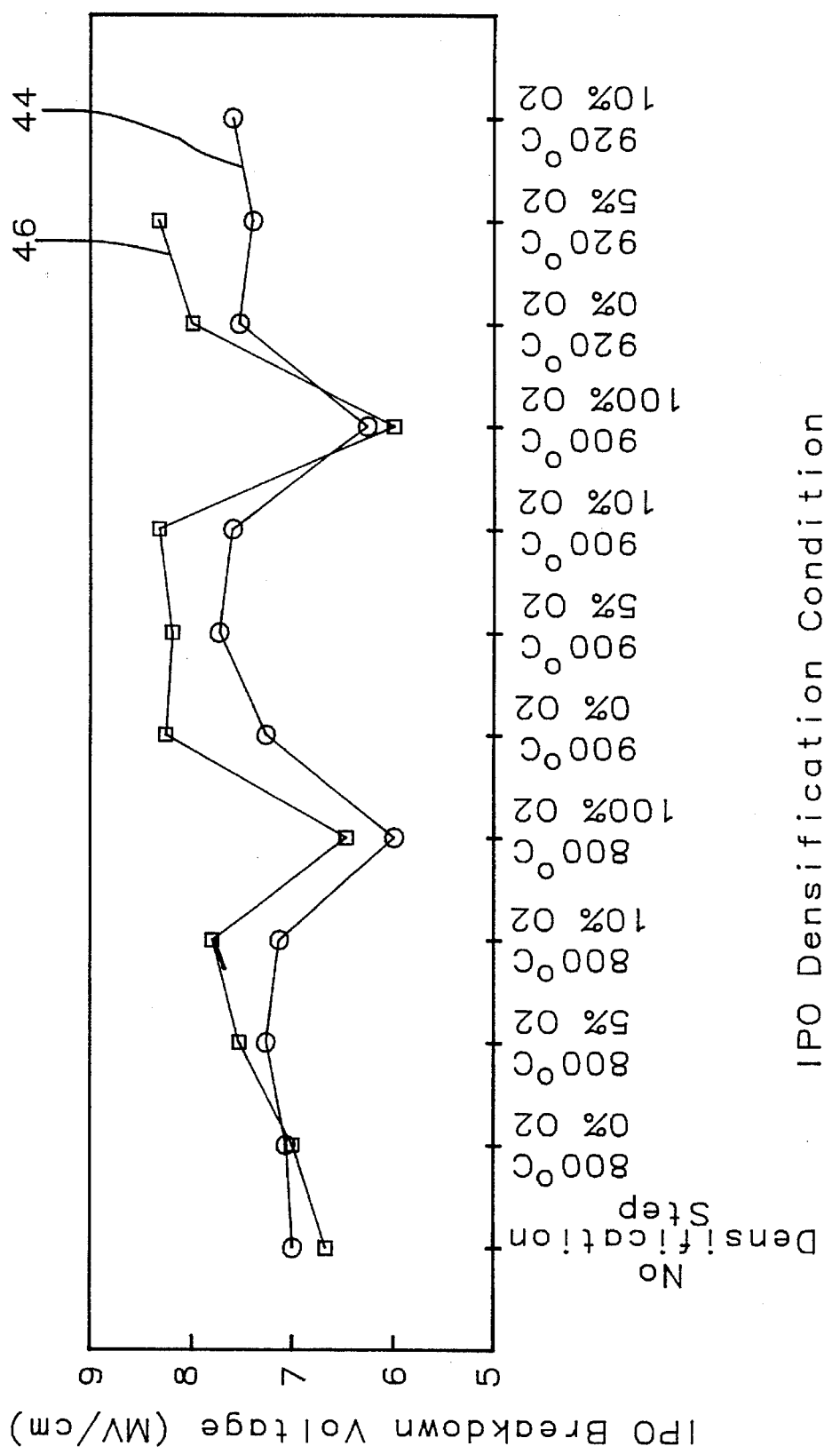
FIG. 8 is a graphical representation of the IPO breakdown voltage for capacitors made with the method of the invention, and using a prior art method.

The IPO breakdown voltage is depicted in FIG. 8, where line 44 represents capacitors made by the method of the invention with no implant, and line 46 represents capacitors with an implant. It can be seen that the breakdown voltages for the capacitors made at the conditions of the invention are roughly equivalent to those of the implanted capacitors. The use of 100% $O_2$ in IPO densification results in a lower breakdown voltage, due to strong oxidation of the $WSi_x$ surface that results in W residues within the increased oxide film.

Figure 9:
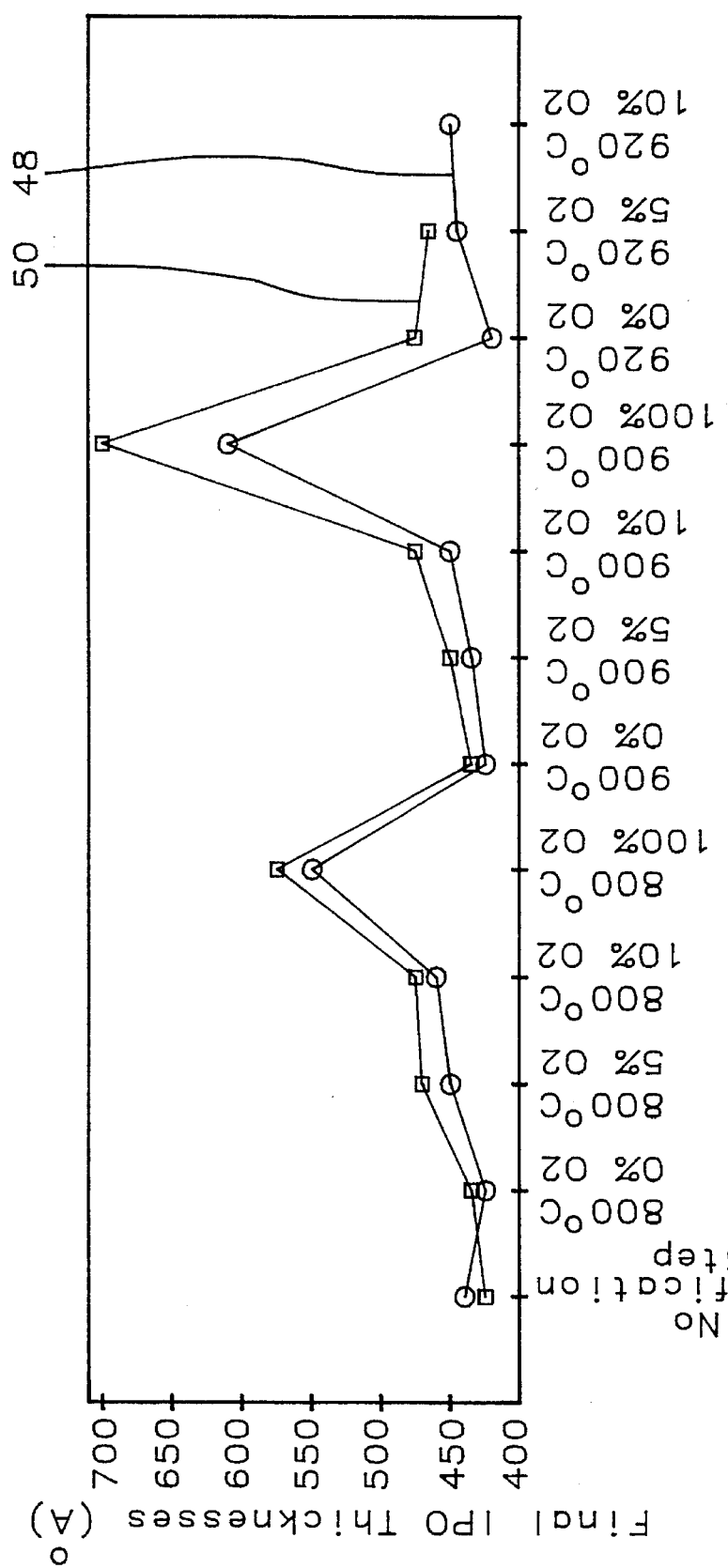
FIG. 9 is a graphical representation of the final IPO thickness for capacitors made with the method of the invention, and using a prior art method.

Referring to FIG. 9, the final IPO thickness is also approximately the same for the capacitor of the invention, depicted by line 48, as for an implanted capacitor in line 50, at the same IPO densification conditions. Since $O_2$ will diffuse through the IPO into the $WSI_x$ surface and oxidize it, 100% $O_2$ gives the greatest IPO thickness.

Figure 10:
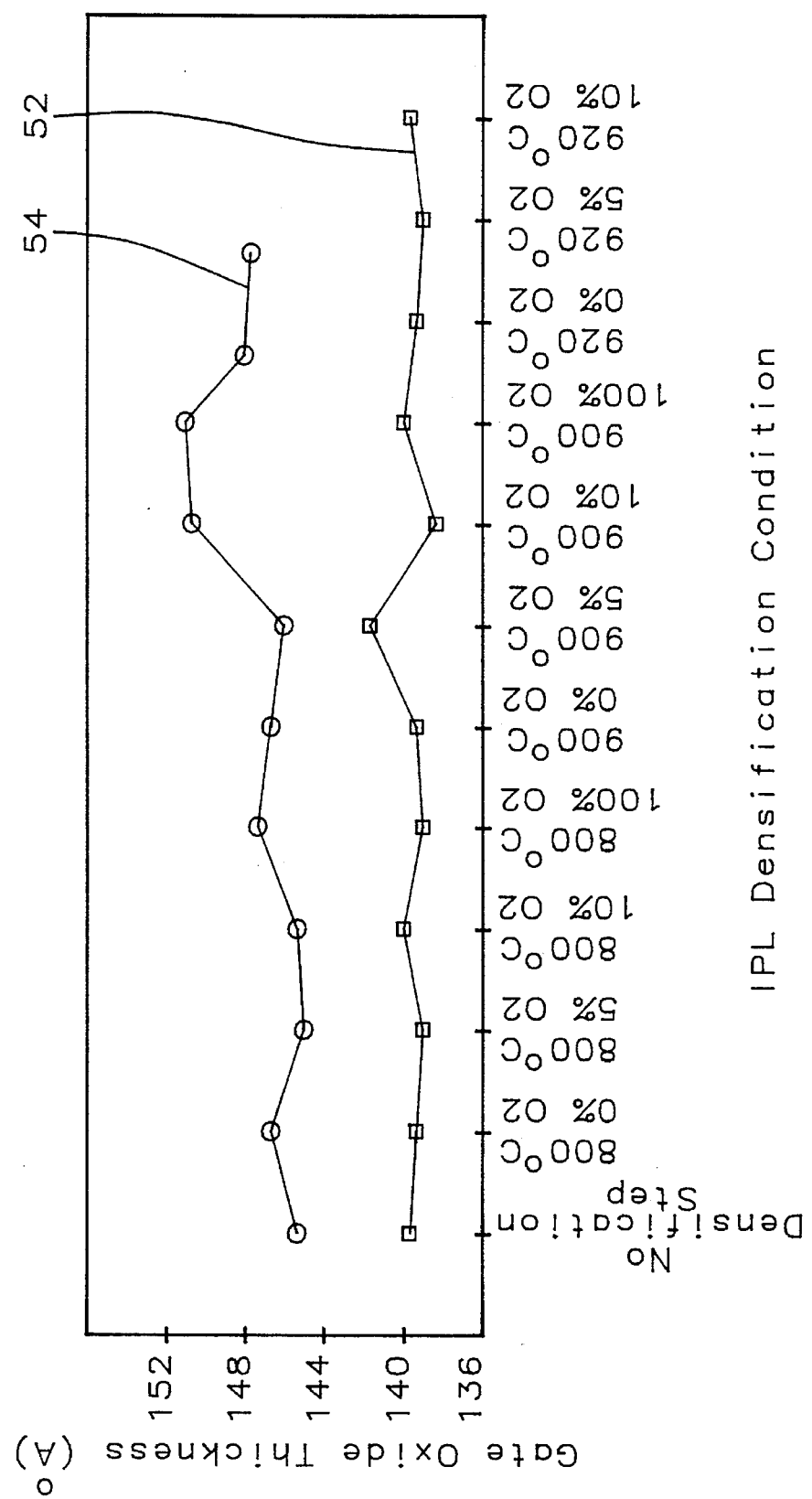
FIG. 10 is a graphical representation of the gate oxide thickness for capacitors made with the method of the invention, and using a prior art method.

As shown in FIG. 10, the gate oxide thickness is shown for the unimplanted capacitor 52 and for the implanted capacitor 54 of the prior art. The gate oxide thickness of the unimplanted $WSi_x$ gate is between about 4 and 8 Angstroms thinner than the implanted gate. This is due to the blocking effect from implanted dopant blocking F (fluorine) out of the $WSi_x$ surface, which induces more F diffusion into the gate oxide for the implanted samples.

While the invention has been particularly shown and described with reference to the preferred embodiments, it will be understood by those skilled in the art that various changes in form and details may be made without departing from the spirit and scope of the invention.

What is claimed is:

1. A method for forming a capacitor on a silicon substrate, comprising the steps of:

forming a first layer of doped polysilicon over said silicon substrate;

forming a silicide layer over said first layer of doped polysilicon;

patterning said first layer of doped polysilicon and said silicide layer to form a polycide bottom plate of said capacitor;

forming an oxide layer over said bottom plate;

first heating said oxide layer to a temperature of about 800° C. for about 30 minutes in 100% N2 (nitrogen) at a flow rate of about 10,000 sccm, then densifying said oxide layer at a temperature of between about 800° and 900° C. in an atmosphere of between about 5 and 10 percent oxygen (O2), said oxygen having a flow rate of between about 500 and 1000 sccm;

forming a second layer of doped polysilicon over said oxide layer;

patterning said second layer of polysilicon to form a top plate of said capacitor;

removing said oxide layer except under said top plate of said capacitor, where it acts as a capacitor dielectric; and annealing said bottom plate.

2. The method of claim 1 wherein said oxide layer is deposited to a thickness of between about 300 and 500 Angstroms.

3. The method of claim 1 wherein said oxide layer is formed by high temperature oxidation using $N_2O$ and $SiH_2Cl_2$ at a temperature of between about 750° and 850 ° C., resulting in a thickness of between about 300 and 500 Angstroms.

4. The method of claim 1 wherein said silicide layer is formed of $WSi_x$ (tungsten silicide), wherein x is between about 2.3 and 2.8.

5. The method of claim 1 wherein said silicide layer is formed to a thickness of between about 1000 and 2000 Angstroms, by depositing tungsten fluoride ($WF_6$) and silane ($SiH_4$) using LPCVD (Low Pressure Chemical Vapor Deposition).

6. The method of claim 1 wherein said polycide bottom plate is annealed at a temperature of between about 850° and 1000° C.

7. A method of forming an integrated circuit, in and on a silicon substrate, which includes a capacitor and an FET (Field Effect Transistor) device with polycide gate, comprising the steps of:

forming field oxide regions and a gate oxide layer in and over said silicon substrate;

forming a first layer of doped polysilicon over said field oxide regions and said gate oxide layer;

forming a silicide layer over said first layer of doped polysilicon;

patterning said first layer of doped polysilicon and said silicide layer to form a polycide bottom plate of said capacitor, and to form said polycide gate;

forming an oxide layer over the resultant structure wherein the polycide bottom plate and polycide gate are formed;

first heating said oxide layer to a temperature of about 800° C. for about 30 minutes in 100% N2 (nitrogen), at a flow rate of about 10,000 sccm then densifying said oxide layer at a temperature of between about 800° and 900° C. in an atmosphere of between about 5 and 10 percent oxygen (O2), said oxygen having a flow rate of between about 500 and 1000 sccm;

forming a second layer of doped polysilicon over said oxide layer;

patterning said second layer of doped polysilicon to form a top plate of said capacitor;

removing said oxide layer except under said top plate of said capacitor, where it acts as a capacitor dielectric;

annealing said bottom plate; and forming source and drain regions for said FET device in said substrate adjacent to said polycide gate.

8. The method of claim 7 wherein said oxide layer is deposited to a thickness of between about 300 and 500 Angstroms.

9. The method of claim 7 wherein said oxide layer is formed by high temperature oxidation using $N_2O$ and $SiH_2Cl_2$ at a temperature of between about 750° and 850 ° C., resulting in a thickness of between about 300 and 500 Angstroms.

10. The method of claim 7 wherein said silicide layer is formed of $WSi_x$ (tungsten silicide), wherein x is between about 2.3 and 2.8.

11. The method of claim 7 wherein said silicide layer is formed to a thickness of between about 1000 and 2000 Angstroms, by depositing tungsten fluoride ($WF_6$) and silane ($SiH_4$) using LPCVD.

12. The method of claim 7 wherein said polycide bottom plate is annealed at a temperature of between about 850° and 1000° C.

* * * * *